United States Patent
Tomioka et al.

[11] Patent Number: 5,897,713
[45] Date of Patent: Apr. 27, 1999

[54] PLASMA GENERATING APPARATUS

[75] Inventors: Kazuhiro Tomioka, Tokyo; Makoto Sekine, Yokohama, both of Japan

[73] Assignee: Kabushiki Kaisha Toshiba, Kawasaki, Japan

[21] Appl. No.: 08/714,998

[22] Filed: Sep. 17, 1996

[30] Foreign Application Priority Data

Sep. 18, 1995 [JP] Japan .................................. 7-238843

[51] Int. Cl.⁶ .................................................. C23C 16/00
[52] U.S. Cl. .................. 118/723 I; 156/345; 315/111.51
[58] Field of Search ............................ 118/723 R, 723 I, 118/723 IR, 723 AN; 156/345; 204/298.02, 298.08, 298.34; 315/111.21, 111.51

[56] References Cited

U.S. PATENT DOCUMENTS

| | | | |
|---|---|---|---|
| 5,146,137 | 9/1992 | Gesche et al. | 315/111.21 |
| 5,401,350 | 3/1995 | Patrick et al. | 156/345 |
| 5,554,223 | 9/1996 | Imahasho | 118/723 I |
| 5,680,014 | 10/1997 | Miyamoto et al. | 315/111.41 |

FOREIGN PATENT DOCUMENTS 4 232243  8/1992  Japan .

*Primary Examiner*—Bruce Breneman
*Assistant Examiner*—Luz Alejandro
*Attorney, Agent, or Firm*—Oblon, Spivak, McClelland, Maier & Neustadt, P.C.

[57] ABSTRACT

A plasma generating apparatus includes a container defining a hermetic process room. The container is connected to an exhaust for exhausting an interior of the process room and setting the interior of the process room to a vacuum, and a supply for supplying a process gas into the process room. First and second coils are wound on the outer surface of the container and disposed coaxially in order to generate in the process room an electric field for converting the process gas into a plasma. The first and second coils are connected to first and second RF power supplies for respectively applying first and second RF powers. The first and second RF powers respectively have first and second frequencies. The first and second frequencies are both 2 MHz or more, and a difference between them is set to fall in a range of from 1 kHz to 2 MHz. Hence, mutual interference of the first and second RF powers generates a synthesized wave having a periodically changing amplitude. This synthesized wave generates in the process room a synthesized wave electric field to which ions in the plasma can follow.

The synthesized wave electric field is utilized for controlling progress of dissociation of the process gas in the plasma.

5 Claims, 10 Drawing Sheets

PLASMA GENERATING APPARATUS

BACKGROUND OF THE INVENTION

1. Field of the Invention

The present invention relates to a plasma generating apparatus and method and, more particularly, to an apparatus and method for generating a plasma used for the purpose of conducting a process, e.g., etching or film formation in, e.g., semiconductor device manufacturing processes.

2. Description of the Related Art

In recent years, a large-scale integrated circuit (LSI) obtained by integrating a large number of elemental devices, e.g., transistors and resistors, on one chip is often employed in the important portion of a computer or communication equipment. Hence, the performance of the entire equipment is closely related to the performance of the LSI. An improvement in performance of a single LSI can be realized by increasing the integration degree, i.e., by micropatterning the elemental devices.

An example of the technique effective for micropatterning the elemental devices includes plasma-assisted techniques, e.g., reactive ion etching and plasma CVD (Chemical Vapor Deposition) For example, with reactive ion etching, ions in the plasma can be vertically radiated on the etching target substrate. Thus, etching can be imparted with anisotropy, enabling formation of a micropattern.

Of LSIs, however, semiconductor devices expected to have a further increase integration degree in the future, such as a 256-Mbit or 1 Gbit DRAM of a next-generation, are coming to require a design rule of quarter micron (0.25 $\mu$m) or less. Thus, in formation of a gate electrode constituting a transistor or in trenching for forming a device isolation region or a memory capacitor, etching capable of realizing microprocessing and a high aspect ratio is required. Conventional reactive ion etching is unlikely to satisfy these requirements.

Figure 15:
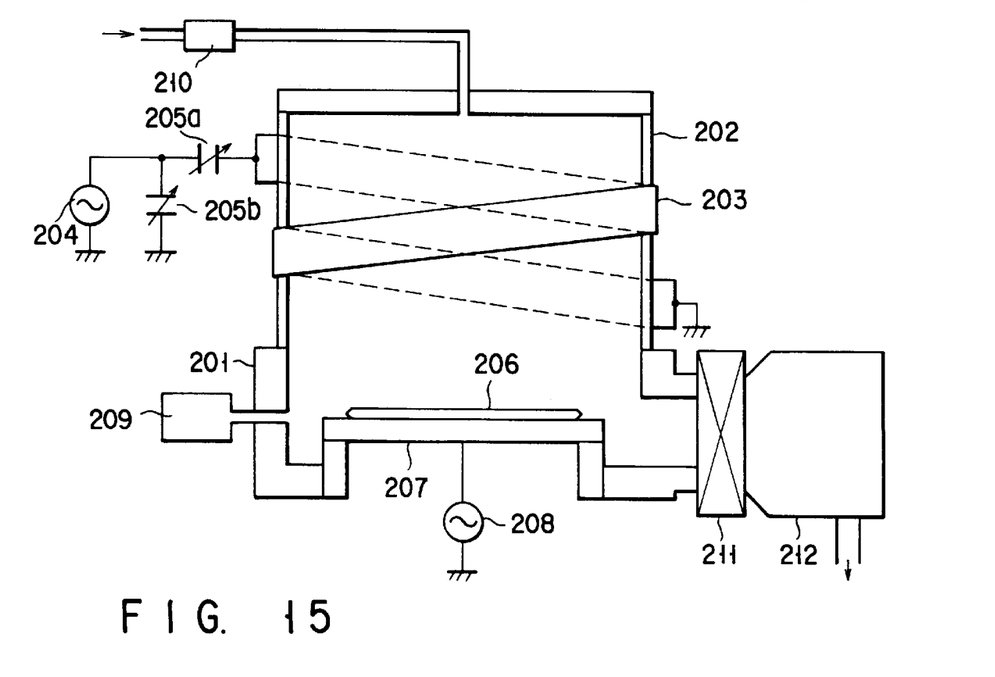
FIG. 15 is a schematic diagram briefly showing the arrangement of a conventional inductive coupling plasma processing apparatus.

FIG. 15 is a schematic diagram briefly showing the arrangement of a conventional inductive coupling plasma etching apparatus (Jpn. Pat. Appln. KOKAI Publication No. 5-206072).

As shown in FIG. 15, a susceptor 207 for placing a target substrate 206 thereon is provided in a process chamber 201. An RF (radio frequency) bias power supply 208 applies an RF bias to the susceptor 207. A quartz cylinder 202 for generating a plasma therein is provided on the process chamber 201. A coil 203 is wound on the outer surface of the quartz cylinder 202.

The process chamber 201 and the quartz cylinder 202 are integrally formed to constitute an etching room.

The coil 203 is connected to a first variable capacitor 205a and a second variable capacitor 205b to a parallel resonance circuit. One terminal of each of the first and second variable capacitors 205a and 205b is connected to an RF power supply 204. The RF power supply 204 supplies an RF power to the parallel resonance circuit.

The process chamber 201 is connected to a turbo-molecular pump 212 through a variable conductance valve 211. The process chamber 201 is provided with a pressure gauge 209. The opening degree of the variable conductance valve 211 is adjusted by using the pressure gauge 209, so that the pressure in the etching room can be set to a desired level.

A gas inlet pipe interposed with a massflow meter 210 is connected to the upper wall of the quartz cylinder 202. With the use of the massflow meter 210, a reactive gas can be introduced into the etching room at a desired flow rate.

An etching method using the plasma etching apparatus having the above arrangement will be described.

By using the massflow meter 210, a fluorocarbon-based process gas (e.g., $CF_4$, $C_2F_6$, $C_3F_8$, or $C_4F_8$) is introduced into the etching room at a predetermined flow rate.

By using the pressure gauge 209, the interior of the etching room is held at a predetermined pressure of about several Pa. In this state, the RF power supply 204 supplies RF power to the coil 203 to generate a plasma in the etching room.

By using the RF bias power supply 208, an RF voltage is applied to the susceptor 207. Thus, ions in the plasma are caused to be vertically incident on the surface of the etching target substrate 206 (silicon oxide film) to anisotropically etch it.

However, the conventional plasma etching apparatus of this type has problems as follows.

For example, when a small contact hole (a hole for connecting a wiring layer on the silicon oxide film with the silicon substrate under the silicon oxide film) is formed in the silicon oxide film, etching rate, etching selectivity (ratio of the etching rate of the silicon oxide film with respect to the etching rate of the silicon substrate) and the planar uniformity of etching anisotropy sometimes exceed the allowable ranges for manufacturing a semiconductor device. In particular, decreases in etching rate and etching selectivity become conspicuous at the central portion of the target substrate. If a stronger RF power is applied to increase electron density thereby increasing ion current incident onto the target substrate, the etching rate tends to be decreased and the planar uniformity of the etching selectivity tends to be worsened.

Generally, where a stronger RF power is applied, the etching rate and etching selectivity of a silicon oxide film are decreased. Furthermore, sometimes the etching rate may be changed depending on the hole diameter of the contact hole and, when the contact hole has a hole diameter on the order of sub-half micron, etching may be stopped midway in a silicon oxide film.

These phenomena may be caused by the following mechanism. That is, as the RF power is increased, the electron density is increased, and dissociation of the process gas is promoted. Then, ions of fluorocarbon of a low fluorine number are incident on the target substrate 206 and attach to the surface of an opening hole. This decreases the etching rate of the silicon oxide film, thereby decreasing the etching selectivity.

A portion of the quartz cylinder 202 close to the coil 203 during use is mainly eroded (erosion via $SiO_2$). Chipped quartz is discharged into the plasma in the form of Si, SiOx, O, and the like. Accordingly, when plasma electric discharge is continued for a long period of time, e.g., for 100 hours or more by using $CF_4$, the quartz cylinder 202 may cause fracture. Application of a strong RF power described above also poses the problem of promoting fracture of the quartz cylinder 202.

Fracture of the quartz cylinder 202 is caused because the closer to the coil 203, the more intensive electric field is formed. More specifically, the electric field near the sheath (sheath electric field) between the plasma and the quartz cylinder 202 increases, so that the high-energy ions in the plasma are adsorbed in the surface of the inner wall of the quartz cylinder 202, thereby causing erosion. When the wall thickness of the quartz cylinder 202 is decreased, the sheath portion further enters the intensive electric field region. Then, erosion progresses fast, and fracture of the quartz cylinder 202 progresses in an accelerated manner.

SUMMARY OF THE INVENTION

It is an object of the present invention to provide a plasma generating apparatus and method capable of controlling progress of dissociation of a process gas regardless of the magnitude of power of the power supply.

It is another object of the present invention to provide a plasma generating apparatus and method capable of preventing erosion and the like of a process chamber.

It is still another object of the present invention to provide a plasma generating apparatus and method in which a processing operation for a target substrate has a high planar uniformity.

According to a first aspect of the present invention, there is provided a plasma generating apparatus comprising:
 a container defining a hermetic process room;
 an exhaust for exhausting an interior of the process room and setting the interior of the process room to a vacuum;
 a supply for supplying a process gas into the process room;
 first and second coils for generating in the process room an electric field for converting the process gas into a plasma; and
 first and second RF power supplies for respectively applying first and second RF powers to the first and second coils, the first and second RF powers respectively having first and second frequencies not less than 2 MHz and different from each other, a difference between the first and second frequencies being set such that mutual interference of the first and second RF powers generates a synthesized wave having a periodically changing amplitude to generate in the process room a synthesized wave electric field to which ions in the plasma can follow, and the synthesized wave electric field being utilized for controlling progress of dissociation of the process gas in the plasma.

According to a second aspect of the present invention, there is provided a plasma generating method comprising the steps of:
 supplying a process gas into a hermetic process room; and
 applying first and second RF powers to first and second coils to generate an electric field in the process room and converting the process gas into a plasma, the first and second RF powers respectively having first and second frequencies not less than 2 MHz and different from each other, a difference between the first and second frequencies being set such that mutual interference of the first and second RF powers generates a synthesized wave having a periodically changing amplitude to generate in the process room a synthesized wave electric field to which ions in the plasma can follow, and the synthesized wave electric field being utilized for controlling progress of dissociation of the process gas in the plasma.

According to a third aspect of the present invention, there is provided a plasma generating apparatus comprising:
 a container defining a hermetic process room;
 an exhaust for exhausting an interior of the process room and setting the interior of the process room to a vacuum, the exhaust having an exhaust port which is open to the process room;
 a first supply for supplying a first process gas into the process room, the first supply having a first supply port which is open to the process room;
 first and second coils for generating in the process room an electric field for converting the first process gas into a plasma, the first and second coils being disposed along a flow of the first process gas from the first supply port to the exhaust port such that the first coil is closer to the first port than the second coil; and
 first and second RF power supplies for respectively applying first and second RF powers different from each other to the first and second coils, a difference between the first and second RF powers being utilized for controlling progress of dissociation of the first process gas in the plasma.

According to a fourth aspect of the present invention, there is provided a plasma generating method comprising the steps of:
 supplying a first process gas into a process room through a first port while exhausting an interior of the process room through an exhaust port; and
 applying first and second RF powers different from each other to first and second coils to generate electric fields in the process room for converting the first process gas into a plasma, the first and second coils being disposed along a flow of the first process gas from the first supply port to the exhaust port such that the first coil is closer to the first port than the second coil, and a difference between the first and second RF powers being utilized for controlling progress of dissociation of the first process gas in the plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

The preferred embodiments of the present invention will be described with reference to the accompanying drawings.

First Embodiment

Figure 1:
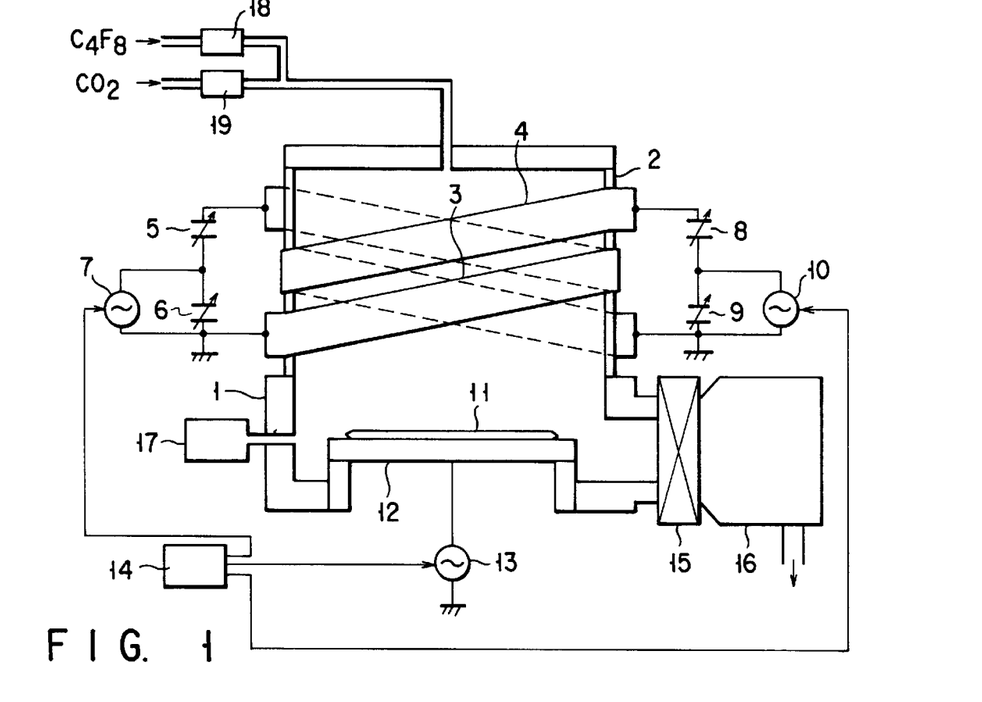
FIG. 1 is a diagram schematically showing the arrangement of a plasma processing apparatus according to the first embodiment of the present invention.

FIG. 1 is a diagram schematically showing the arrangement of a plasma processing apparatus according to the first embodiment of the present invention. As shown in FIG. 1, a susceptor 12 for placing a target substrate 11 thereon is provided in a process chamber 1. An RF bias power supply 13 applies an RF bias to the susceptor 12. A quartz cylinder 2 having an outer diameter of 80 mm is provided on the process chamber 1. A first coil 3 and a second coil 4 are wound on the outer surface of the quartz cylinder 2. The process chamber 1 and the quartz cylinder 2 are integrally formed to constitute a plasma process room. The first and second coils 3 and 4 have substantially the same inductances.

The first coil 3 is connected to a first variable capacitor 5 and a second variable capacitor 6 to constitute a first parallel resonance circuit. One terminal of each of the first and second variable capacitors 5 and 6 is connected to a first RF power supply 7. The RF power supply 7 supplies an RF power to the first parallel resonance circuit. The first RF supply means is thus constituted.

Similarly, the second coil 4 is connected to a third variable capacitor 8 and a fourth variable capacitor 9 to constitute the second parallel resonance circuit. One terminal of each of the third and fourth variable capacitors 8 and 9 is connected to a second RF power supply 10. The second RF power supply 10 supplies an RF power to the second parallel resonance circuit. The second RF supply means is thus constituted.

The output impedance of the first RF power supply 7 is set to 50Ω. Impedance matching of the first RF power supply 7 and first parallel resonance circuit is performed by changing the capacitances of the variable capacitor 5 and second variable capacitor 6.

Similarly, the output impedance of the second RF power supply 10 is set to 50Ω. Impedance matching of the second RF power supply 10 and second parallel resonance circuit is performed by changing the capacitances of the third and fourth variable capacitors 8 and 9.

The process chamber 1 is connected to a turbomolecular pump 16 through a variable conductance valve 15. The process chamber 1 is provided with a pressure gauge 17. The opening degree of the variable conductance valve 15 is adjusted by using the pressure gauge 17, so that the pressure in the plasma process room can be set to a desired level.

A gas inlet pipe interposed with a first massflow meter 18 and a second massflow meter 19 is connected to the upper wall of the quartz cylinder 2. With the use of the massflow meters 18 and 19, $C_4F_8$ gas and $CO_2$ gas can be respectively introduced into the plasma process room at desired flow rates.

The frequencies, phases, and powers of the first and second RF power supplies 7 and 10 and the RF bias power supply 13 can be controlled by an RF power supply controller 14.

An etching method using the plasma processing apparatus having the above arrangement will be described. The characteristic feature of this etching method resides in that the type, distribution, and the like of the ions in the plasma are controlled by the first and second coils 3 and 4 and the like to improve the etching characteristics.

$C_4F_8$ gas and $CO_2$ gas are introduced into the plasma process room respectively at flow rates of 10 sccm and 300 sccm by using the first and second massflow meters 18 and 19. At this time, the opening degree of the variable conductance valve 15 is adjusted by using the pressure gauge 17, so that the pressure in the plasma process room is held at 0.5 Pa.

The first RF power having a frequency of 13.56 MHz and a power of 1.4 kW is applied to the first coil 3 by the first RF power supply 7, and the second RF power having a frequency of 13.56 MHz and a power of 1.4 kW is applied to the second coil 4 by the second RF power supply 10 at the same phase as that of the first RF power, so that a plasma is generated in the plasma process room. During this plasma generation, an RF bias having a frequency of 400 kHz and a power of 800 W is applied to the susceptor 12 by the RF bias power supply 13, thereby performing anisotropic etching.

The frequencies, phases, and powers of the first and second RF power supplies 7 and 10 and the RF bias power supply 13 are controlled by the RF power supply controller 14.

Figure 2:
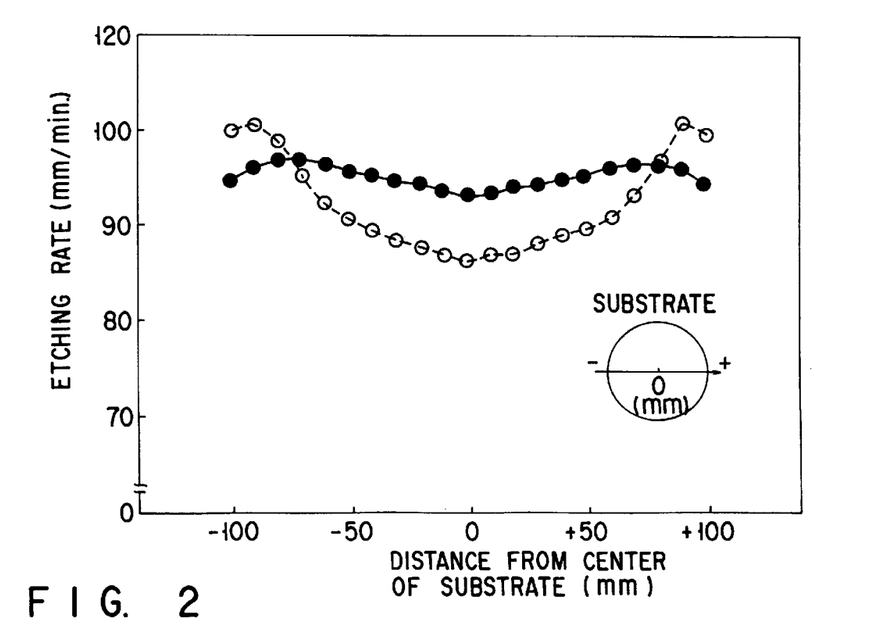
FIG. 2 is a graph of distributions of the etching rates on a target substrate to indicate the effect of the present invention.

In FIG. 2, white dots show the distribution of etching rates obtained when a circular target substrate 11 having a surface entirely coated with a silicon oxide film was etched under the above conditions (the frequencies of the first and second RF power supplies 7 and 10 are both 13.56 MHz).

Figure 3A:
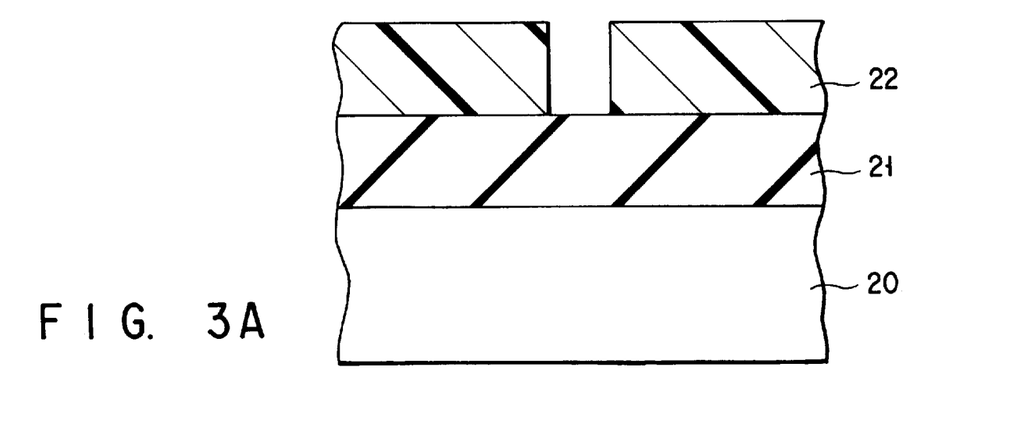
FIGS. 3A, 3B, and 3C are sectional views showing target substrates to explain an etching method employing the plasma processing apparatus shown in FIG. 1.

More specifically, as shown in FIG. 3A, a silicon oxide film 21 on a silicon substrate 20 was etched along a resist 22 to form a contact hole having a small hole diameter.

Figure 3B:
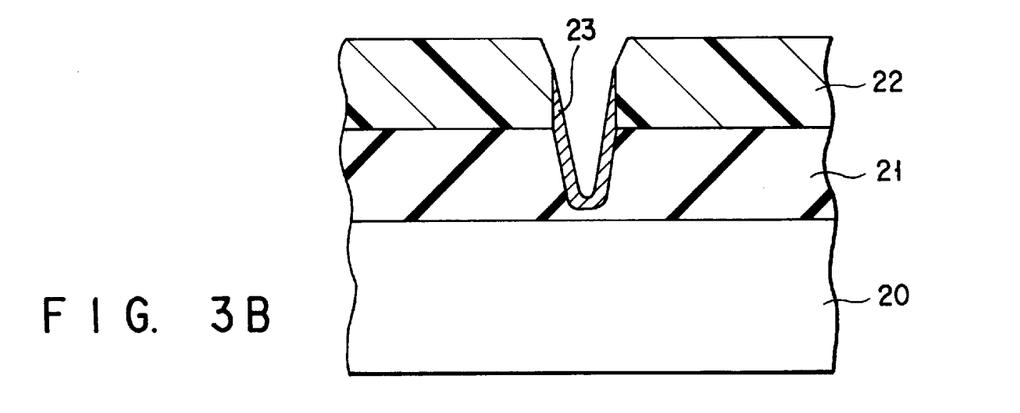

In practice, however, as shown in FIG. 3B, a thick etching deposit 23a was deposited on the bottom portion and side wall of the contact hole. Thus, etching was stopped midway in the silicon oxide film 21, and a contact hole reaching the silicon substrate 20 could not be formed.

In consideration of the above, the frequency of the second RF power supply 10 was slightly shifted in a direction to decrease the frequency from 13.56 MHz. More specifically, the frequency was reset to 13.21 MHz to form a contact hole having a small hole diameter. Except for this, the conditions are equal to those described above.

In FIG. 2, black dots show the distribution of etching rates obtained when a circular target substrate 11 having a surface entirely coated with a silicon oxide film was etched under these conditions (the frequencies of the first and second RF power supplies 7 and 10 are 13.56 MHz and 13.21 MHz, respectively). It is apparent from FIG. 2 that the etching rate is increased, particularly at the central portion of the substrate, and the planar uniformity of the etching rate is improved.

Figure 3C:
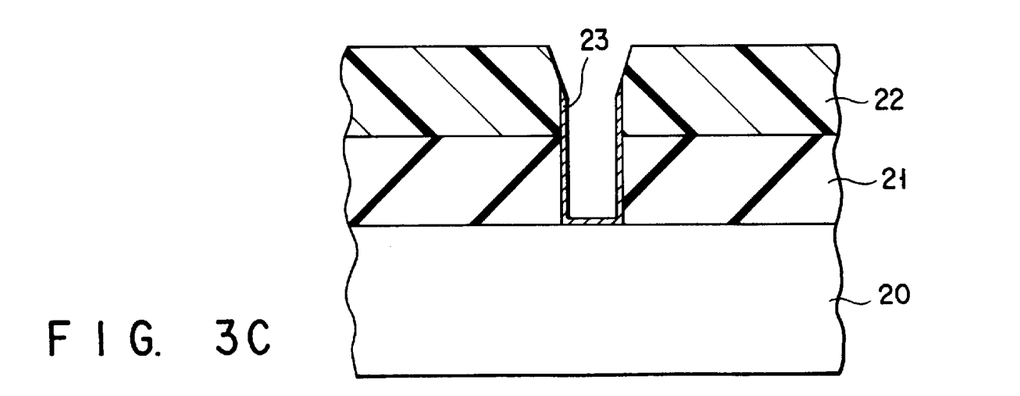

In this case, as shown in FIG. 3C, a thin etching deposit 23b was deposited on the bottom portion and side wall of the contact hole. Thus, etching was not stopped midway in a silicon oxide film 21, and a small-diameter silicon hole reaching a silicon substrate 20 could be formed. More specifically, contact holes each having a hole diameter of 0.25 µm and an aspect ratio of 8 could be formed on the entire surface of the substrate.

The reason for this result is assumed to be as follows.

When the frequencies of the first and second RF power supplies 7 and 10 are slightly shifted from each other, beat occurs depending on a frequency difference $\Delta f$ (350 kHz). More specifically, due to the mutual interference of the waves of the two RF powers from the first and second RF power supplies 7 and 10, a synthesized wave having a periodically changing amplitude is generated. By this synthesized wave, another electric field different from the electric fields generated by the two RF powers of the first and second RF power supplies 7 and 10 is generated in the quartz cylinder 2.

Ions in the plasma move to follow this synthesized wave electric field, thus promoting generation of the plasma. More specifically, even if the powers of the power supplies are not increased, progress of dissociation of the process gas can be controlled by changing the frequency difference $\Delta f$, so that the types and energies of generated ions can be changed. Accordingly, plasma generating conditions optimum for etching can be obtained.

The synthesized wave uniformly propagates in the horizontal direction in the quartz cylinder 2. Accordingly, the synthesized wave electric field is uniformly formed in the horizontal direction. Hence, if generation of the plasma or progress of dissociation of the process gas is controlled by the frequency difference $\Delta f$, the etching rate, the etching selectivity, and the planar uniformity of etching anisotropy with respect to the target substrate are greatly improved when compared to a case wherein generation of the plasma or progress of dissociation of the process gas depends on the intensities of the powers of the power supplies.

In this embodiment, the frequencies of the RF waves generated by the first and second RF power supplies 7 and 10 are 13.56 MHz and 13.21 MHz, respectively, and the frequency difference $\Delta f$ between them is thus 350 kHz. However, the frequency difference $\Delta f$ can be changed in accordance with parameters, e.g., the sizes of the process chamber 1 and quartz cylinder 2, and the diameters, pitches, and the numbers of turns of the first and second coils 3 and 4. Note that both of the above two frequencies are preferably about 2 MHz or more.

Since the frequency difference $\Delta f$ is employed for generating a synthesized wave electric field to which ions follow, it preferably falls within a range of from 1 kHz to 2 MHz.

Figure 4:
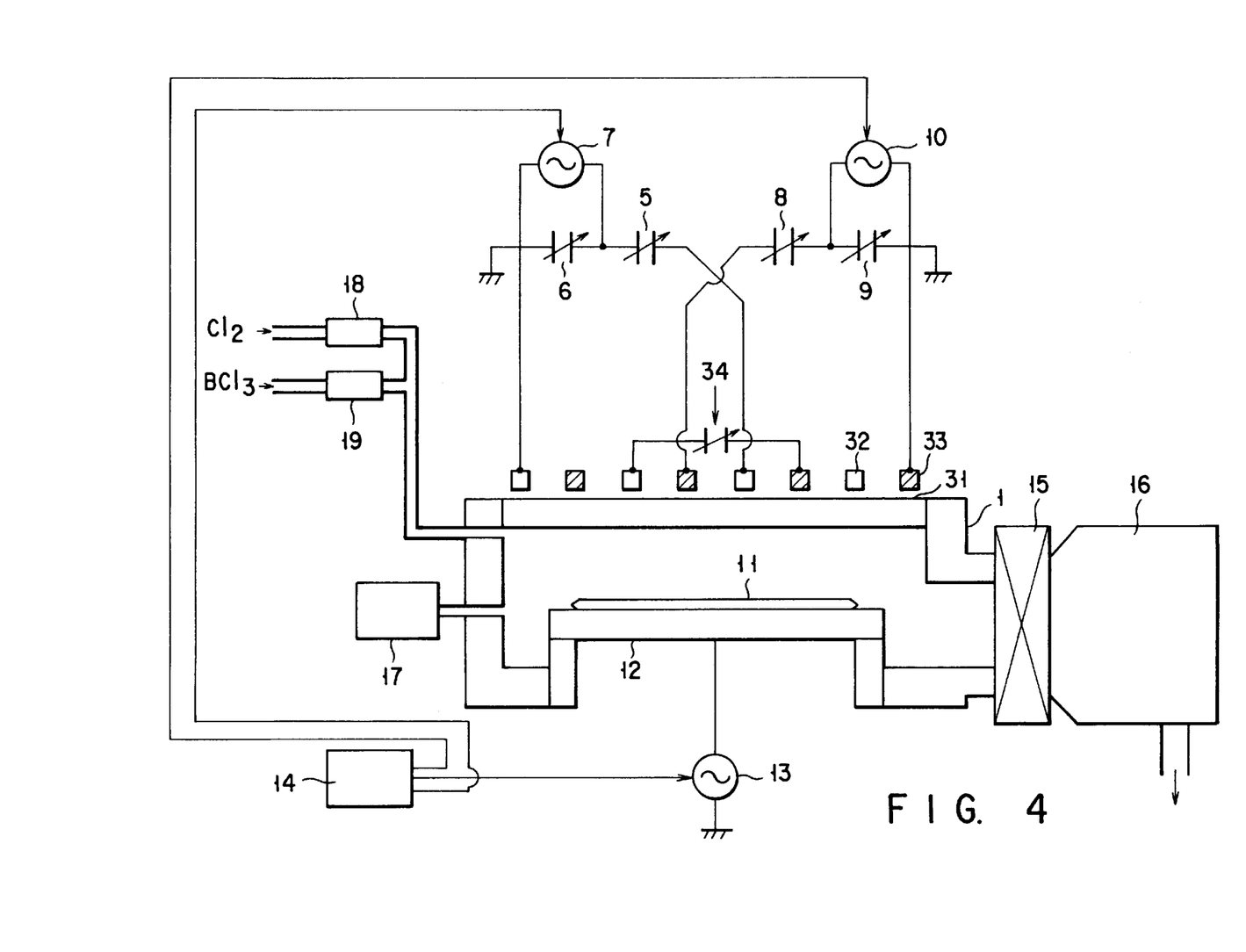
FIG. 4 is a diagram schematically showing the arrangement of a plasma processing apparatus according to the second embodiment of the present invention.
Figure 5:
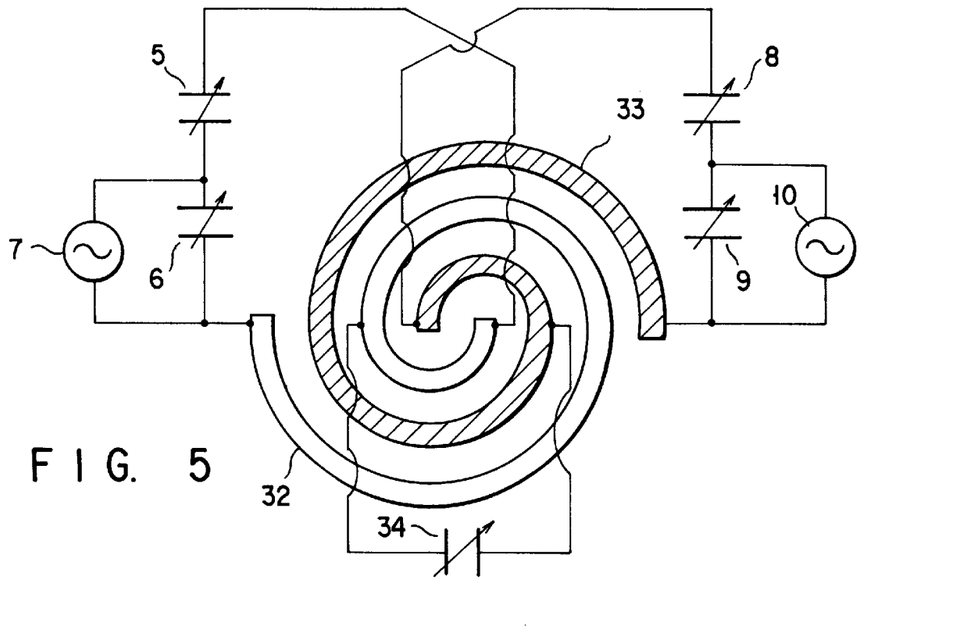
FIG. 5 is a diagram of the plasma processing apparatus of FIG. 4 seen from above.

FIG. 4 is a diagram schematically showing the arrangement of a plasma processing apparatus according to the second embodiment of the present invention, and FIG. 5 is a diagram of the plasma processing apparatus of FIG. 4 seen from above. In FIGS. 4 and 5, portions corresponding to those in the plasma processing apparatus of FIG. 1 are denoted by the same reference numerals, and a detailed description thereof will be omitted.

In this embodiment, a quartz plate 31 is employed in place of the quartz cylinder 2, thus constituting a flat plasma process room. A first spiral coil 32 and a second spiral coil 33 respectively corresponding to the first coil 3 and the second coil 4 are disposed above the plasma process room.

A fifth variable capacitor 34 is arranged in a tap provided between the first and second spiral coils 32 and 33. With the fifth variable capacitor 34, the coupling degree of the first and second parallel resonance circuits can be changed.

Figure 6A:
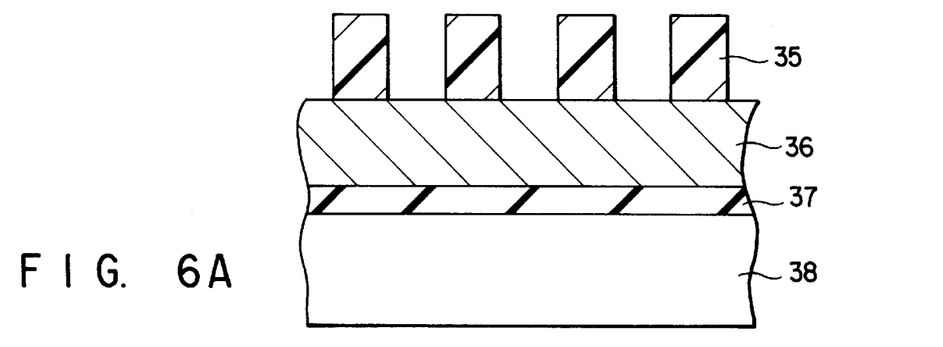
FIGS. 6A and 6B are sectional views showing target substrates to explain an etching method employing the plasma processing apparatus shown in FIG. 4.
Figure 6B:
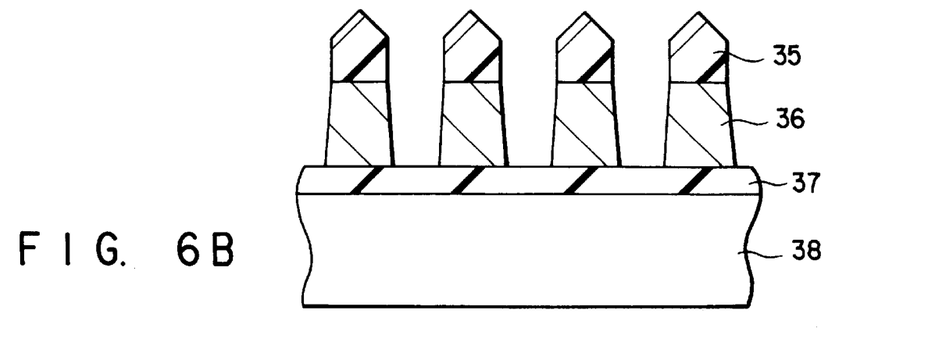

An etching method using the plasma processing apparatus having the above arrangement will be described. More specifically, a case will be described wherein an alloy film 36 of Al with Si (1%) and Cu (0.5%) is etched by using a photoresist pattern 35 as a mask with a design rule of 0.25 µm as shown in FIGS. 6A and 6B, thus forming a micropatterned wiring layer. In FIGS. 6A and 6B, reference numeral 38 denotes a silicon substrate; and 37, a silicon oxide film.

$Cl_2$ and $BCl_3$ gases are introduced into the plasma process room respectively at flow rates of 50 sccm and 25 sccm by using first and second massflow meters 18 and 19. At this time, the opening degree of a variable conductance valve 15 is adjusted by using a pressure gauge 17, so that the pressure in the plasma process room is held at 0.3 Pa.

The first RF power having a frequency of 13.56 MHz and a power of 300 W is applied to the first coil 3 by a first RF power supply 7, and the second RF power having a frequency of 13.56 MHz and a power of 300 W is applied to the second coil 4 by a second RF power supply 10 at the same phase as that of the first RF power, so that a plasma is generated in the plasma process room. During this plasma generation, an RF bias having a frequency of 2 MHz and a power of 300 W is applied to a susceptor 12 by a bias power supply 13, thereby performing anisotropic etching.

The frequencies, phases, and powers of the first and second RF power supplies 7 and 10 and the bias power supply 13 are controlled by an RF power supply controller 14.

Figure 7:
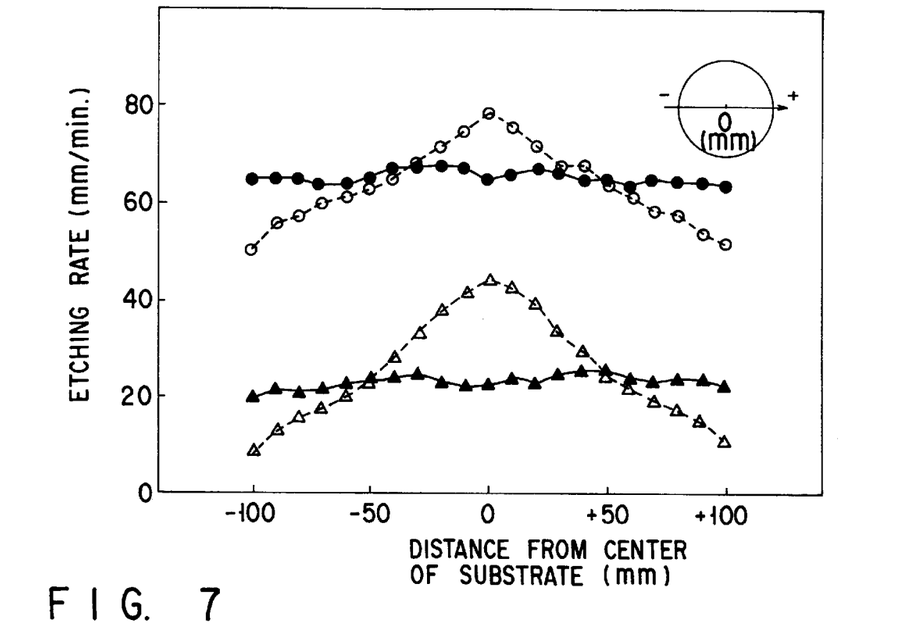
FIG. 7 is a graph of distributions of the etching rates on a target substrate to indicate the effect of the present invention.

In FIG. 7, white dots 7 show the distribution of the etching rates of an alloy film 36, and white triangles show the distribution of the etching rates of a photoresist pattern 35, when etching was performed under the above conditions (the frequencies of the first and second RF power supplies 7 and 10 are both 13.56 MHz).

As is apparent from FIG. 7, the etching rates of the alloy film 36 vary largely and the selectivity ((etching rate of alloy film 36)/(etching rate of photoresist pattern 35)) against the resist at the central portion of the substrate is 2 or less. Thus, if the alloy film 36 is thick, it is difficult to form a micropatterned wiring layer.

Hence, the frequency of the second RF power supply 10 was slightly shifted in a direction to decrease the frequency from 13.56 MHz. More specifically, the frequency was reset to 13.21 MHz, and a power of 300 W was generated and applied to the second coil 4 to form a micropatterned wiring layer. Note that the capacitance of the fifth variable capacitor 34 was set to about 4 pF.

In FIG. 7, black dots show the distribution of etching rates of the alloy film 36 and black triangles show the distribution of etching rates of the photoresist pattern 35, when etching was performed under these conditions (the frequencies of the first and second RF power supplies 7 and 10 are 13.56 MHz and 13.21 MHz, respectively).

As is apparent from FIG. 7, the uniformity of the etching rate distribution of the alloy film 36 is improved, and the selectivity with respect to the resist can be maintained at 3 or more on the entire surface of the substrate.

In this embodiment, the frequencies of the RF waves generated by the first and second RF power supplies 7 and 10 are set to 13.56 MHz and 13.21 MHz, respectively. However, it suffices if these two frequencies are about 2 MHz or more, and the frequency difference Δf may be changed as required within a range of from 1 kHz to 2 MHz.

In the first and second embodiments, the frequencies of the biases applied to the susceptor 12 are respectively 400 kHz and 2 MHz. However, it suffices if these frequencies fall within a range of about 100 kHz to 150 MHz to which ions can follow or with which a negative self-bias is generated.

In the first and second embodiments, plasma processing was exemplified by etching. However, the present invention can be applied to any other plasma processing, e.g., plasma CVD and surface improvement or cleaning by the plasma.

Third Embodiment

Figure 8:
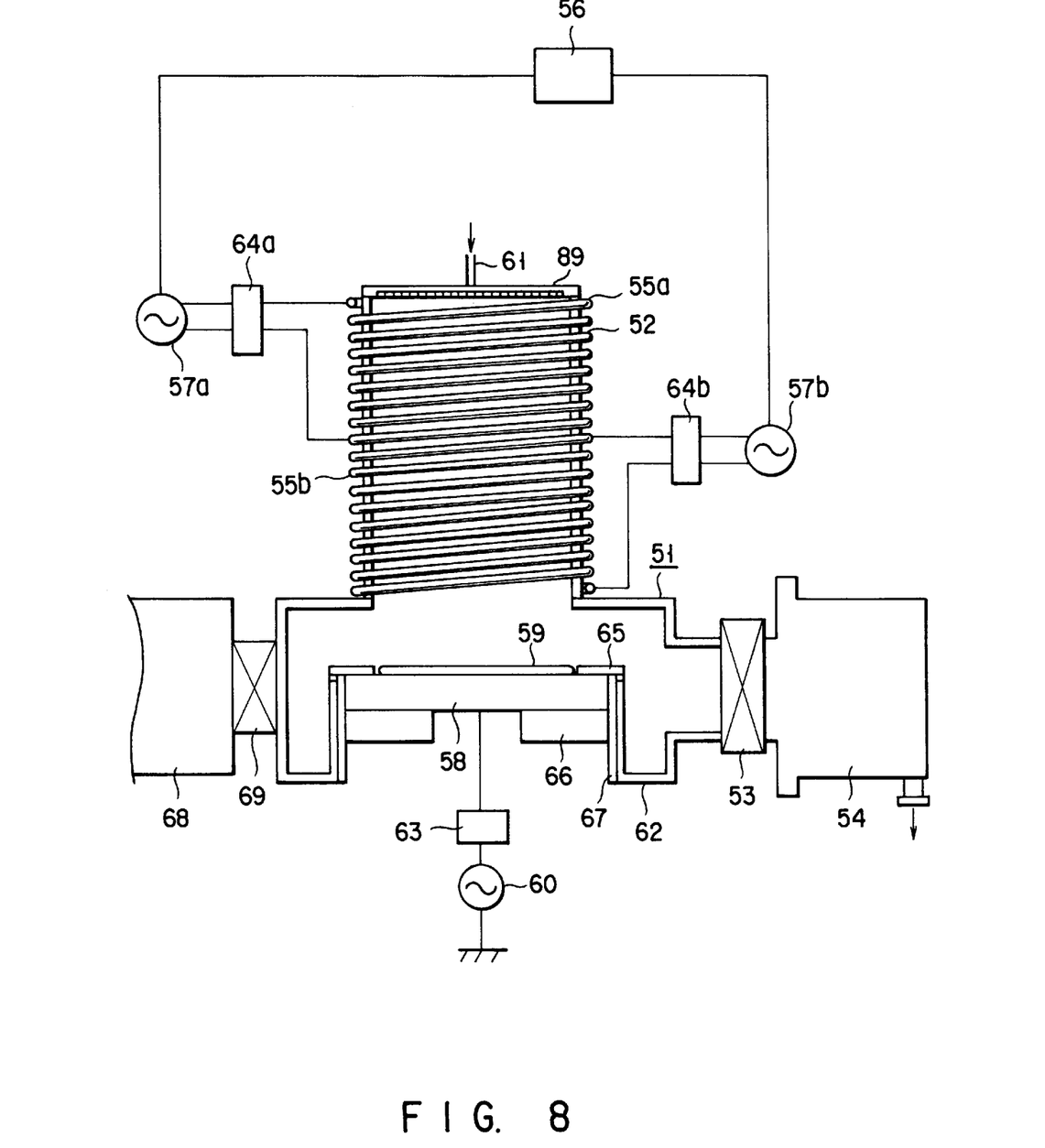
FIG. 8 is a diagram schematically showing the arrangement of a plasma processing apparatus according to the third embodiment of the present invention.

FIG. 8 is a diagram schematically showing the arrangement of a plasma processing apparatus according to the third embodiment of the present invention.

As shown in FIG. 8, a plasma process room 51 is constituted by a quartz cylinder 52 and a process chamber 62. A susceptor 58 for placing a target substrate 59 thereon is provided in the process chamber 62. The plasma process room 51 is evacuated by a turbo-molecular pump 54 through a gate valve 53. A first coil 55a and a second coil 55b are wound on the outer surface of the plasma process room 51. These two coils 55a and 55b are coaxially, vertically arranged.

An RF power (having a frequency of, e.g., 2 MHz) obtained by an RF oscillator 56 is amplified to 1.5 kW by a first RF power amplifier 57a and applied to the first coil 55a through an impedance matching unit 64a. The RF power obtained by the RF oscillator 56 is amplified to 1.5 kW by a second RF power amplifier 57b and also applied to the second coil 55b through an impedance matching unit 64b.

The susceptor 58 is connected to a bias generator 60 through an impedance matching unit 63. The bias generator 60 applies an RF bias of 13.56 MHz to the susceptor 58.

The target substrate 59 is fixed on the temperature-controlled susceptor 58 with an electrostatic chuck mechanism (not shown). A gas, e.g., helium gas, is introduced to the bottom surface of the target substrate 59 to a pressure of about 10 Torr in order to increase the thermal conductivity between the target substrate 59 and the susceptor 58.

A gas inlet pipe 61 for introducing a reactive process gas is connected to the upper wall of the quartz cylinder 52. The process gas is introduced into the plasma process room 51 at a predetermined flow rate and a predetermined pressure by a massflow controller and a pressure gauge (not shown).

In FIG. 8, reference numeral 65 denotes a peripheral ring; 66, an insulating member; 68, a load-lock chamber; 69, a gate valve; and 89, a shower head.

An etching method using the plasma etching apparatus having the above arrangement will be described.

Figure 9A:
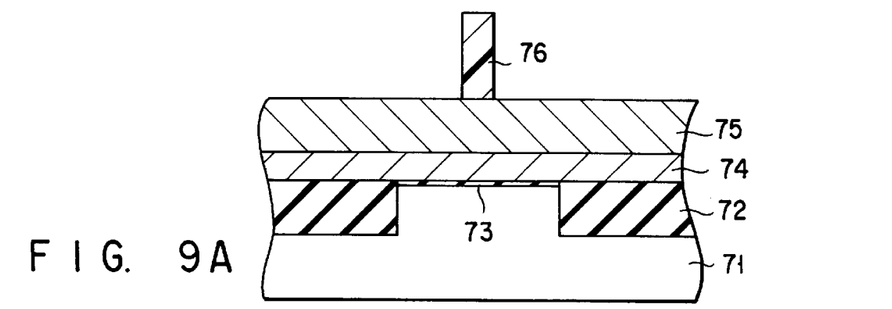
FIGS. 9A, 9B, and 9C are sectional views showing target substrates to explain an etching method employing the plasma processing apparatus shown in FIG. 8.

As the target substrate 59, one obtained by sequentially forming a thin gate oxide film 73 of silicon oxide and having a thickness of 8 nm, a thin n$^+$-type polysilicon film 74, and a thin WSi film 75 on an 8-inch diameter silicon substrate 71 was employed, as shown in FIG. 9A.

A thin stacked film comprising the WSi film 75 and the n$^+$-type polysilicon film 74 was etched by using a resist pattern 76 as the mask. In FIG. 9A, reference numeral 72 denotes a device isolation insulating film.

Since the etching target thin film is a stacked film having a two-layered structure, in some cases depending on the natures of the individual films, the etching conditions must be altered during etching in accordance with the individual films. Since the underlying gate oxide film 73 is thin, a high etching selectivity is required between the n$^+$-type polysilicon film 74 and gate oxide film 73.

For these reasons, in this embodiment, as the etching conditions for the upper WSi film 75, $Cl_2$=20 sccm, $O_2$=10 sccm, gas pressure=3 mTorr, the power of the RF wave applied to the first and second coils 55a and 55b=1 kW, the power of the RF bias=150 W, and the temperature of the susceptor 58=40° C. were set.

Figure 9B:
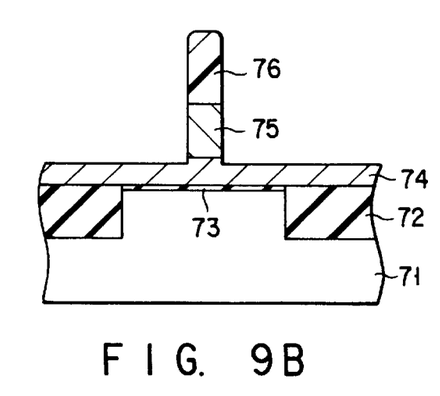

Under these conditions, the etching rate of the WSi film 75 was about 0.45 μm/min, and an etched shape with a vertical side surface was achieved (FIG. 9B). The etching rate of the lower n$^+$-type polysilicon film 74 under the same conditions was about 0.3 μm/min. In other words, the etching selectivity of the WSi film 75 with respect to the n$^+$-type polysilicon film 74 was about 1.5.

As the etching conditions for the lower n$^+$-type polysilicon film 74, HBr=50 sccm, gas pressure=1 Pa, the power of the RF wave applied to the first coil 55a=1 kW, and the power of the RF wave applied to the second coil 55b=0.4 kW were set.

The RF power to the second coil 55b was decreased in order to decrease the etching rate of the gate oxide film 73. More specifically, when the n$^+$-type polysilicon film 74 was over-etched, etching of the exposed gate oxide film 73 was minimized.

To etch the n$^+$-type polysilicon film 74, many free radical species (Br atoms in this case) are required, and such free radical species are mostly generated by the first coil 55a. Even if free radicals having a comparatively long lifetime are generated remote from the silicon substrate 71, a sufficient amount of free radicals are supplied to the silicon substrate 71 by diffusion or a gas flow.

When an ion current amount is increased, the etching rate of the gate oxide film 73 is undesirably increased. Hence, ions in an amount exceeding that required for etching the n$^+$-type polysilicon film 74 should not be supplied to the silicon substrate 71. The ions have a short lifetime, and ions reaching the silicon substrate 71 are mostly those generated near the silicon substrate 71. Accordingly, the number of ions can be controlled by the coil closer to the silicon substrate 71, i.e., by the second coil 55b.

According to this embodiment, when the RF power of the second coil 55b was decreased, the etching selectivity with respect to the gate oxide film 73 could be increased without decreasing the etching rate of the n$^+$-type polysilicon film 74.

The RF bias power was set to 100 W, and the susceptor temperature was set to 40° C. Under these conditions, the etching rate of the n$^+$-type polysilicon film 74 was about 0.35 μm/min, and the etching selectivity ((film 74)/(film 73)) with respect to the gate oxide film 73 was about 95.

Figure 9C:
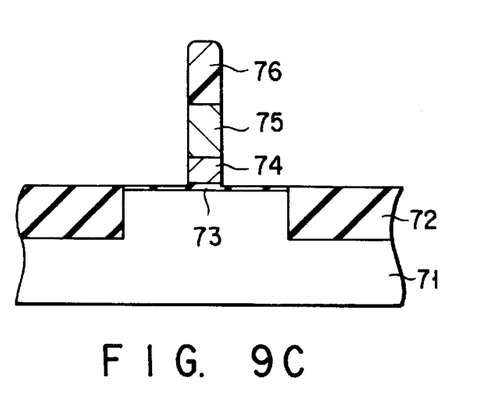

The obtained etched shape was a good one having a vertical side surface, as shown in FIG. 9C. Apparently, a so-called critical dimension loss was extremely small.

According to this embodiment, the electric field generated on the inner surface of the quartz cylinder 52 could be decreased more than in the conventional case. This is because a process conventionally performed by applying a 2-kW power to one coil is performed by applying a 1-kW power to each of the first and second coils 55a and 55b. In other words, this is because the peak value of the voltage amplitude of the RF power applied to the first and second coils 55a and 55b can be sufficiently decreased when compared to a case using a single coil with the same arrangement as that of this embodiment. More specifically, it was found that a power of 1.4 kW used in a conventional apparatus could be decreased to 0.67 kV in this embodiment.

Plasma electric discharge was repeatedly performed in practice, and erosion of the interior of the quartz cylinder 52 was examined. Even after a cumulative electric discharge time of 100 hours elapsed, no trace of erosion along the coils, which was conventionally observed, could not be found. A phenomenon in which the inner surface of the quartz cylinder 52 was etched and part of the resultant etching product attached to the inner surface of the metal portion of the plasma process room 51 to form a deposition film was not observed. Furthermore, even after long-time plasma electric discharge, the etching characteristics as described above did not substantially change, and stable etching was possible. These effects can be obtained in the first and second embodiments as well with a mechanism identical to the mechanism described above.

Fourth Embodiment

Figure 10:
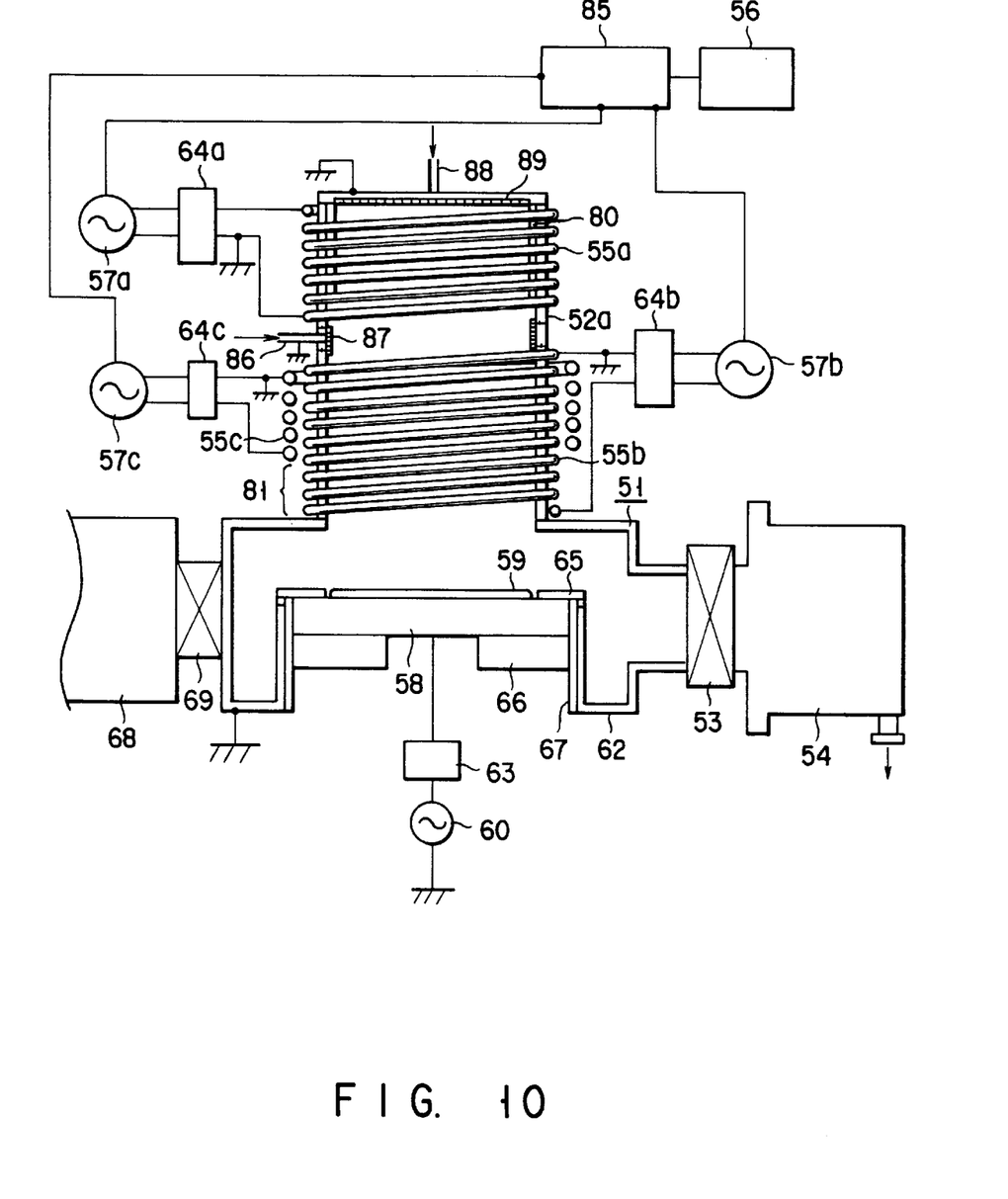
FIG. 10 is a diagram schematically showing the arrangement of a plasma processing apparatus according to the fourth embodiment of the present invention.

FIG. 10 is a diagram schematically showing the arrangement of a plasma processing apparatus according to the fourth embodiment of the present invention. Portions corresponding to those in the plasma processing apparatus of FIG. 8 are denoted by the same reference numerals, and a detailed description thereof will be omitted.

In this embodiment, three coils 55a to 55c are employed. The first coil 55a is identical to that of the third embodiment. The second and third coils 55b and 55c are wound one over the other. The fourth embodiment is different from the third embodiment in this respect. The third coil 55c is connected to an RF power amplifier 57c through an impedance matching unit 64c.

Furthermore, in this embodiment, an output signal from an RF oscillator 56 is phase-shifted by an RF phase shifter 85 and supplied to RF power amplifiers 57a and 57b, and the RF power amplifier 57c.

A second gas is introduced from a position between the first and second coils 55a and 55b through a second gas inlet pipe 86 and a shower head 87. The gas supply openings of the shower head 87 are formed to be directed to a target substrate 59, so that the gas can be uniformly supplied toward the target substrate 59.

In this embodiment, a silicon plate 80 having a high resistivity (containing a small amount of impurities) is arranged near the inner wall of a quartz cylinder 52 on which the first coil 55a is wound.

A film formation method using the plasma processing apparatus having the above arrangement will be described. This film formation method is used in part of a process of forming a structure shown in the sectional view of FIG. 11.

Figure 11:
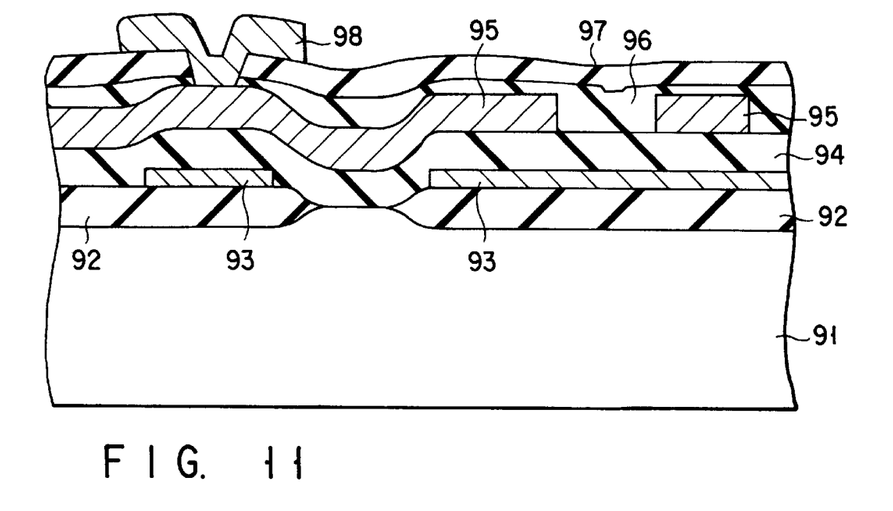
FIG. 11 is a sectional view showing the structure of a device formed by using the plasma processing apparatus of FIG. 10.

Referring to FIG. 11, reference numeral 91 denotes an 8-inch diameter silicon substrate on which elemental devices (not shown), e.g., transistors, are formed. A device isolation insulating film 92 is formed on the surface of the silicon substrate 91, and a first metal wiring layer 93 is formed on the device isolation insulating film 92. Furthermore, a first insulating interlayer 94 is formed on the silicon substrate 91 having an exposed surface, the device isolation insulating film 92, and the metal wiring 93. A second metal wiring layer 95 is formed on the insulating interlayer 94. Second and third insulating interlayers 96 and 97 are formed on the resultant structure, and a third metal wiring layer 98 is connected to the second metal wiring layer 95 through a via hole formed in the insulating interlayers 96 and 97.

In this manner, in state-of-the-art semiconductor devices, the integration degree is increased by stacking several metal (currently, mostly using an Al alloy) wiring layers. In the case of such a micropatterned structure in which a metal wiring lateral distance in one layer is small, the dielectric constant of the insulating interlayers 94, 96, and 97 is a significant factor that determines the response speed of the metal wiring layer. The lower the dielectric constant, the higher the operating speed of the device. For this reason, recently, an attempt is made in which a normal insulating interlayer (oxide film) is doped with several % of F to decrease the dielectric constant (for example, refer to Preparatory Papers of the 16th Dry Process Symposium by Miyajima et. al, p. 133, 1994, by Denki Gakkai). An explanation will be made by way of a process of generating such an F-doped insulating interlayer having a low dielectric constant.

A gas mixture of $CF_4$ (flow rate: 15 sccm) and $O_2$ (flow rate: 20 sccm) is introduced through a first gas inlet pipe 88 and a shower head 89. A gas mixture of TEOS (tetraethoxysilane; flow rate: 15 sccm) and $O_2$ (flow rate: 30 sccm) is introduced through the second gas inlet pipe 86 and the shower head 87. A process room 51 is evacuated by a turbo-molecular pump 54. The pressure in the process room 51 is set to 7.5 mTorr by adjusting the conductance of an exhaust valve 53.

RF waves having an RF power of 1.5 kW, 0.7 kW, and 1.5 kW and a frequency of 13.56 MHz are respectively applied to the first to third coils 55a to 55c. The target substrate 59 is fixed on the susceptor 58 with a ceramic electrostatic chuck, and the susceptor temperature is maintained at 400° C. The RF bias applied to the susceptor 58 has a frequency of 400 kHz and a power of 100 W.

An insulating thin film formed under the above conditions had a dielectric constant of 3.2. When the composition of this insulating thin film was analyzed in accordance with FT-IR (Fourier-transform infrared spectroscopy), a good result was obtained in which Si-F/Si-O indicating the content of fluorine was about 5% and the infrared absorption peak resulting from the OH group as the impurity was less than the detection limit. An OH group degrades reliability when the device is operated for a long period of time. The OH group increases even after the formed film is exposed to the atmosphere and the water content in the atmosphere is absorbed by the film.

The insulating thin film formed in accordance with this embodiment was let to stand in the atmosphere of a clean room for one week. An increase in absorption peak intensity resulting from the OH group was not observed. Erosion of the inner surface of the quartz cylinder 52 was not observed at all, and emission from the quartz wall did not influence film formation at all with electric discharge of several 10 hours.

The reason why such excellent film can be formed is assumed as follows.

The gas mixture of $CF_4$ and $O_2$ introduced from the gas inlet pipe 88 is decomposed by the plasma generated by the first coil 55a. Thus, active species, e.g., F, CFx (x=1 to 3), O, CO, COF, and the like, and respective ions are generated. At this time, the silicon substrate 91 having a high resistance absorbs the RF wave to a certain degree so that it is heated to about 250° C. or more by so-called RF heating. The silicon substrate 91 heated to the high temperature easily reacts with F and a compound of F, e.g., CFx.

Since a high voltage is generated at the terminal of the first coil 55a, an intensive electric field is generated also on the inner surface of the plasma process room, i.e., near the surface of the silicon substrate 91. Then, the ion species are attracted by the silicon substrate 91 to etch silicon. These etching reactions generate SiFx (x=1 to 4), or $SiOF_1$ or $SiOF_2$.

The gas mixture of TEOS and $O_2$ introduced through the second gas inlet pipe 86 is excited as it contacts the active species decomposed and generated by the plasma generated by the first coil 55a. Decomposition further progresses in high-density plasma by means of the second and third coils 55b and 55c.

The second coil 55b has a larger width (the width of a region existing in the vertical direction) than that of the third coil 55c. Hence, in a region 81 surrounded by only the second coil 55b, the plasma density may decrease from its upper portion, and the decomposition may progress when the active species described above are transported within the region 81, thereby generating a deposition species serving as the precursor of the deposition film.

The ions generated in the region 81 reach the surface of the silicon substrate 91 to promote the reaction of the deposition species adsorbed on the surface, thus aiding formation of a high-quality film. The reaction in this case is a reaction in which the deposition species described above further capture O atoms and F atoms and discharge weakly coupled H, while promoting formation of a network forming a film.

In this manner, the plasma characteristics, e.g., plasma density, in a plasma electric discharge space can be controlled, so that a plasma appropriate for forming an F-doped silicon oxide film can be generated.

Even if the superposing second and third coils 55b and 55c generate a very high-density plasma, when a high power is dispersedly supplied by a plurality of coils, stable plasma surface processing (film formation in this case) can be performed over a long period of time without causing erosion of the inner surface of the quartz cylinder 52.

On the other hand, a high power is supplied to a single coil, the coil 55a, to intentionally generate a high-intensity electric field portion on the surface of the inner wall, thereby etching the added sacrificial wall material (silicon in this embodiment) and hence allowing to utilize the etching product as a film formation material.

Regarding the phases of the RF powers supplied to the respective coils 55a to 55c in the above process, the RF powers of the first and second coils 55a and 55b are set in the same phase. Then, the RF phase of the third coil 55c is gradually changed so that the plasma density becomes the maximum.

It is difficult to place a probe or the like in the plasma process room to directly measure the plasma density, because the coils are wound on the outer surface of the quartz cylinder 52. If, however, light emission of the plasma leaking from the gap of the coils is measured, the plasma density can be measured. The plasma density is maximized by utilizing measurement of the plasma density based on this light emission. Since the phase difference between the second and third coils 55b and 55c depends on the length, pitch, and the like of the individual coils, it must be adjusted in accordance with the actual coils.

The phase of the RF power of the first coil 55a is shifted without changing the phase relationship of the RF powers of the second and third coils 55b and 55c. The plasma density also changes in this case. Note that an increase in plasma density is not the purpose, and the plasma density is set such that desired film characteristics (contents of fluorine, hydrogen and carbon, the dielectric constant, the moisture absorption, and the like) are satisfied while performing film formation as required.

In this embodiment, when the phase of the first coil 55a is 0°, the phases of the second and third coils 55b and 55c are set to 0° and 120°, respectively. The phases of the first and second coils 55a and 55b are set equal because, since the coil terminal of the gas inlet pipe 86 side is set at the ground potential, its phase difference does not influence the process.

Fifth Embodiment

Figure 12:
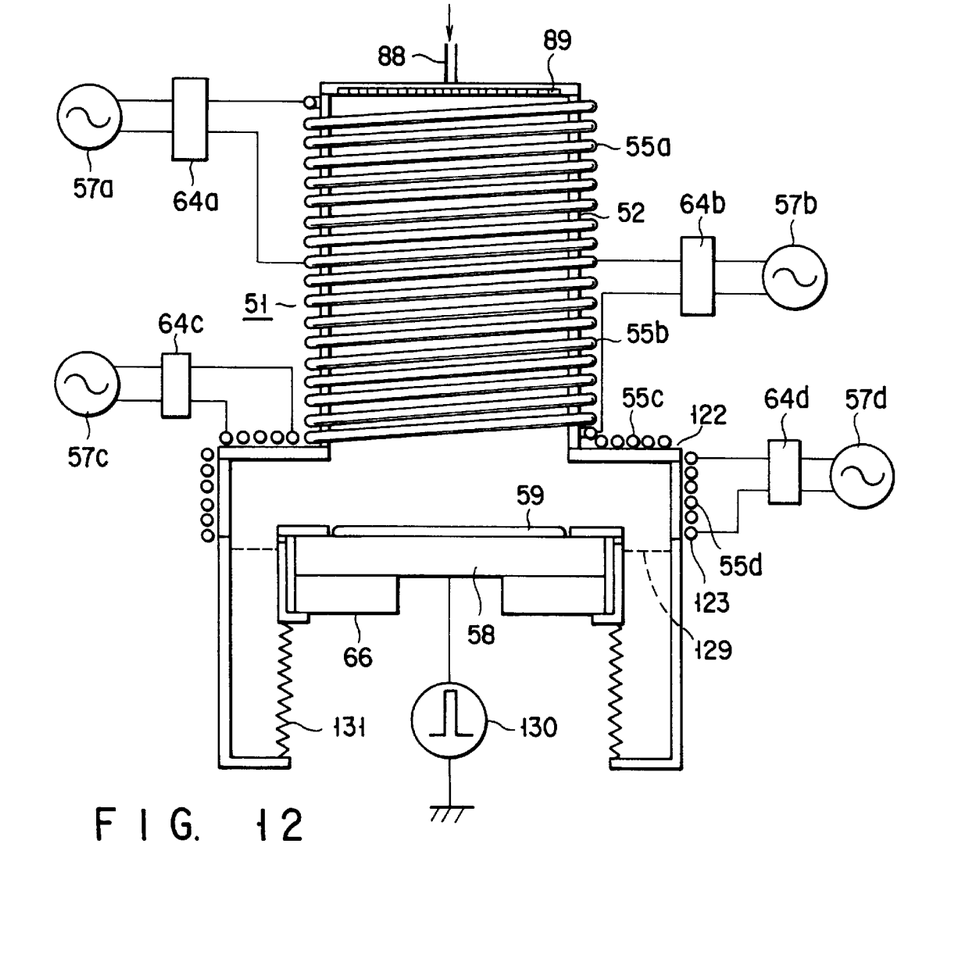
FIG. 12 is a diagram schematically showing the arrangement of a plasma processing apparatus according to the fifth embodiment of the present invention.

FIG. 12 is a diagram schematically showing the arrangement of a plasma processing apparatus according to the fifth embodiment of the present invention. Portions corresponding to those of the plasma processing apparatuses of FIGS. 8 and 10 are denoted by the same reference numerals as in FIGS. 8 and 10, and a detailed description thereof will be omitted.

In this embodiment, four coils 55a to 55d are used. The first and second coils 55a and 55b are identical to those of the third embodiment. The third coil 55c is arranged on a dielectric plate 122 in a spiral manner, and the fourth coil 55d is wound on the outer surface of a dielectric cylinder 123. The respective coils 55a to 55d are respectively connected to RF power supplies 57a to 57d through impedance matching units 64a to 64d to receive RF powers from them.

In this embodiment, a susceptor 58 is connected to a high-voltage power supply 130 that generates a high pulse voltage. The high-voltage power supply 130 can instantaneously apply to the susceptor 58 a high voltage of several kV required for ion-implanting impurities.

Ion implantation employing the plasma processing apparatus having the above arrangement will be described.

First, $BF_3$ gas is introduced into a plasma process room 51, and RF power of 0.8 kW is applied to the first and second coils 55a and 55b to generate a plasma, thereby decomposing the $BF_3$ gas and generating $B^+$ ions. A high pulse voltage is applied to the susceptor 58 to attract the $B^+$ ions, so that B as the impurity is implanted in a target substrate 59.

The implantation depth is determined by the application voltage (potential of the target substrate 59) of the susceptor 58, and the implantation amount is determined by an ion current amount that can be obtained from the plasma. The ion current amount is a function of plasma density and application voltage.

The third and fourth coils 55c and 55d are utilized to control the plasma density near the target substrate 59. More specifically, a power of 0.5 to 1.2 kW is supplied to the third coil 55c, and a power of 0.2 to 1 kW is applied to the fourth coil 55d in an interlocked manner to the third coil 55c. This prevents the plasma density on the peripheral portion of the target substrate 59 from decreasing.

Thus, according to this embodiment, the plasma density of the target substrate 59 is controlled mainly by the RF power applied to the second coil 55b, so that the impurity can be ion-implanted at a desired dose. Since the plurality of coils 55a to 55d are used, the intensity of the electric field generated on the surfaces of the dielectric members, e.g., a quartz cylinder 52, the dielectric plate 122, the dielectric cylinder 123, and the like can be decreased more than in a conventional apparatus, thereby preventing erosion.

Sixth Embodiment

Figure 13:
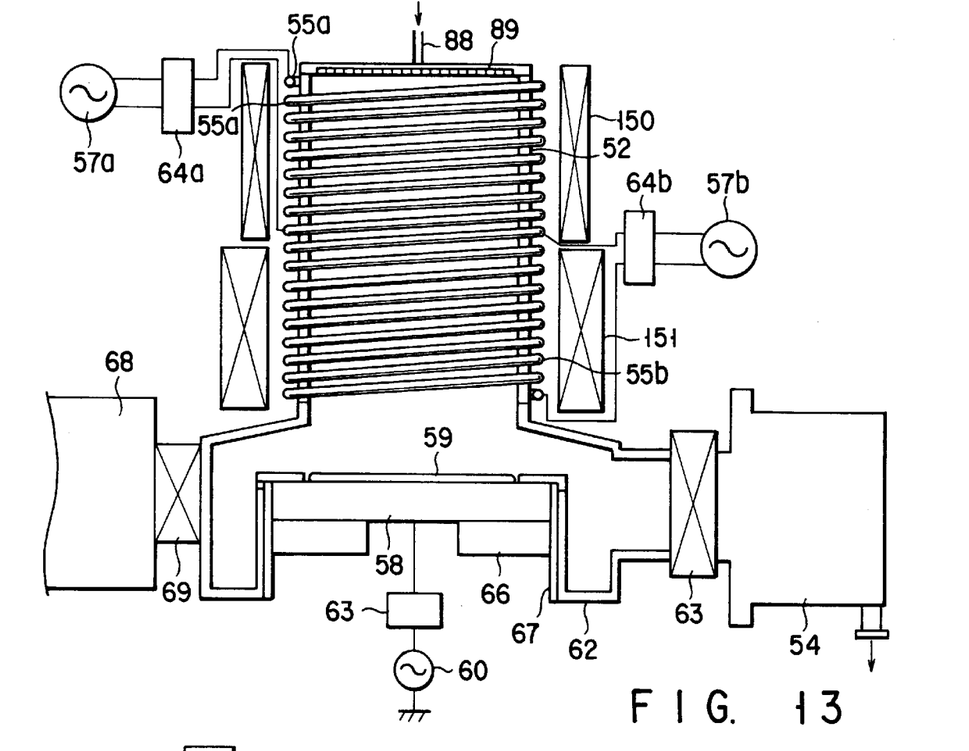
FIG. 13 is a diagram schematically showing the arrangement of a plasma processing apparatus according to the sixth embodiment of the present invention.

FIG. 13 is a diagram schematically showing the arrangement of a plasma processing apparatus according to the sixth embodiment of the present invention. Portions corresponding to those of the plasma processing apparatus of FIG. 8 are denoted by the same reference numerals as in FIG. 8, and a detailed description will be omitted.

The characteristic feature of this embodiment resides in that erosion of the inner wall of a quartz cylinder 52 is further decreased by improving the uniformity of the plasma density by utilizing a magnetic field.

In FIG. 13, reference numerals 150 and 151 denote first and second electromagnets constituted by solenoid coils. Vertical magnetic fields are generated inside the first and second electromagnets 150 and 151. The first and second electromagnets 150 and 151 are respectively arranged outside first and second coils 55a and 55b.

An etching method using the plasma processing apparatus having the above arrangement will be described. More specifically, this etching method is one employed when forming a trench in the surface of a silicon substrate.

A gas mixture of HBr (150 sccm), $NF_3$ (12 sccm), and $O_2$ (7 sccm) is used as the etching gas. The gas pressure is set to 5 mTorr.

An RF wave having a frequency of 13.56 MHz and a power of 2 kW is applied to the first coil 55a by an RF power supply 57a, and an RF wave having a frequency of 40.68 MHz and a power of 2.5 kW is applied to the second coil 55b by an RF power supply 57b. An RF bias having a frequency of 500 kHz and a power of 800 W is applied to a susceptor 58 by a bias generator 60. A target substrate 59 (silicon substrate in this case) is controlled to about 30° C. by a cooling mechanism (not shown).

For the purpose of this embodiment, an intensive magnetic field is preferably generated near the inner wall of the quartz cylinder 52. Accordingly, in this embodiment, the magnetic field intensity was set to be about 200 G on the inner wall of the quartz cylinder 52 near the center of the first electromagnet 150 and to be about 250 G on the inner wall of the quartz cylinder 52 near the center of the second electromagnet 151.

In this case, the magnetic field intensities near the central axis of the quartz cylinder 52 were about 115 G and 150 G. Also, the magnetic field intensity on the surface of the target substrate 59 was 90 G near the center and about 120 G on the peripheral portion. In order to further improve the uniformity of the plasma density, the magnetic field (including the direction of the magnetic vector) near the surface of the target substrate 59 must preferably be uniformed.

Under these conditions, by using an oxide film formed on the silicon substrate as the mask, the silicon substrate was etched to form a trench. A deep trench groove having a hole diameter of 0.3 $\mu$m and a depth of 9 $\mu$min could be formed. The etching rate was 2.3 $\mu$m/min, and the selectivity of the silicon substrate with respect to the oxide film was 35.

No erosion was observed on the inner wall of the quartz cylinder 52, and a very thin deposition film was observed. This is assumed to be a product generated by the etching reaction and attached to the quartz cylinder 52.

In this embodiment, the frequency of the RF wave supplied to the second coil 55b is set higher than that of the RF wave supplied to the first coil 55a and the power is further increased, so that the plasma density can be increased near the substrate.

Even with such a high power, magnetic fields substantially parallel to a dielectric pipe are further supplied by using the plurality of coils 55a and 55b, as in this embodiment, so that a stable etching process is enabled over a long period of time.

Seventh Embodiment

Figure 14:
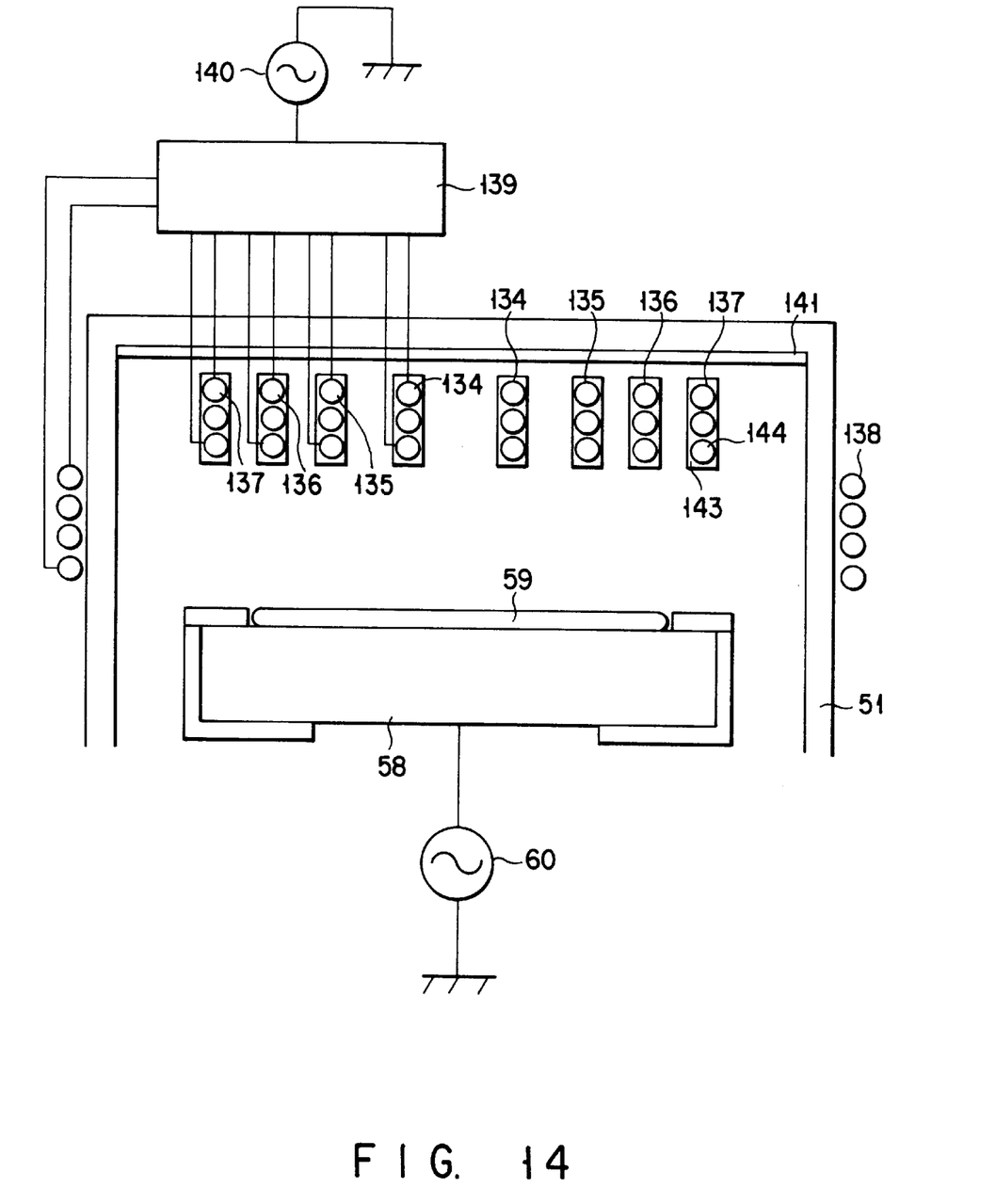
FIG. 14 is a diagram schematically showing the arrangement of a plasma processing apparatus according to the seventh embodiment of the present invention.

FIG. 14 is a diagram schematically showing the arrangement of a plasma processing apparatus (etching apparatus) according to the seventh embodiment of the present invention. Portions corresponding to those of the plasma processing apparatus of FIG. 8 are denoted by the same reference numerals as in FIG. 8, and a detailed description thereof will be omitted.

In FIG. 14, reference numerals 134, 135, 136, and 137 denote first to fourth antenna coils arranged coaxially. Each of the coils 134 to 137 is obtained by sealing a metal coil body 144 with a mold member 143, e.g., quartz. This aims at preventing the coil body 144 from being directly exposed to the plasma and etched. In this embodiment, the outer surface of the mold member 143 that seals the coil body 144 corresponds to the inner wall of the quartz cylinder 52. Accordingly, this embodiment aims at corrosion prevention of the mold member 143.

An oxide film etching method using the plasma processing apparatus having the above arrangement will be described.

A gas mixture of $C_4F_8$ (flow rate: 10 sccm) and CO (flow rate: 200 sccm) is used as the etching gas, and the gas pressure is set to 10 mTorr.

RF waves having powers of 100 W, 150 W, and 200 W are respectively applied to the first to fourth antenna coils 134 to 137. Furthermore, 800 W is applied to a coil 138 through RF power supply 140 and RF power supply controller 139. The frequency is commonly 2 MHz. The coil 138 and the antenna coils 134 to 137 are arranged coaxially.

A low-frequency power of 380 kHz is applied to a susceptor 58 to attract ions generated by the plasma to a target substrate 59, thus promoting an etching reaction.

According to this method, a high-density plasma is easily generated in the space among the coils 134 to 137. Furthermore, a plasma having a comparatively high plasma density is generated even near the side surface of the plasma process room 51 by the coil 138 on the side surface of a plasma process room 51. Thus, the plasma density is not decreased on the peripheral portion of the target substrate 59, so that etching can be performed very uniformly.

In the third to seventh embodiments, a plurality of coils are arranged coaxially. This aims at generation of a circular plasma having a uniform plasma density so that a circular target substrate is plasma-processed uniformly. Accordingly, if the conditions, e.g., the shape, of the target substrate change, the arrangement of the coils can be changed as required. Furthermore, various modifications can be made in the process by shifting the frequencies or adjusting the phases of the RF waves among the plurality of coils. Uniformity of active species generation or plasma spatial distribution can be improved by modulating the RF wave applied to some coils within a range of several kHz to several 100 kHz.

In the third to seventh embodiments, plasma processing is described by way of etching, CVD, and ion implantation. However, the present invention can also be applied to any other plasma processing, e.g., surface improvement or surface cleaning by the plasma. In any application, the process characteristics, the productivity and durability of the apparatus, and the like can be improved remarkably.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma generating apparatus comprising:

a container defining a hermetic process room;

an exhaust means for exhausting an interior of the process room and setting the interior of said process room to a vacuum;

a supply for supplying a process gas into said process room;

first and second coils for generating in said process room an electric field for converting the process gas into a plasma; and first and second RF power supplies for respectively applying first and second RF powers to said first and second coils, the first and second RF powers respectively having first and second frequencies not less than 2 MHZ and different from each other, a difference between the first and second frequencies being set such that mutual interference of the first and second RF powers generates a synthesized wave having a periodically changing amplitude to generate in said process room a synthesized wave electric field to which ions in the plasma can follow, and the synthesized wave electric field being utilized for controlling progress of dissociation of the process gas in the plasma, wherein said first coil and said first RF power supply form a first parallel resonance circuit together with a capacitor, and said second coil and second RF power supply form a second parallel resonance circuit together with a capacitor.

2. An apparatus according to claim 1, wherein the difference between the first and second frequencies is set to fall within a range of from 1 kHz to 2 MHz.

3. An apparatus according to claim 1, wherein said first and second parallel resonance circuits are connected to each other through a variable capacitor.

4. An apparatus according to claim 1, wherein said first and second coils are wound on an outer surface of said container and arranged coaxially.

5. An apparatus according to claim 1, further comprising a work table disposed in said process room to support a target substrate, the target substrate being subjected to a processing operation by using the plasma.

* * * * *